(12) United States Patent
Liang (10) Patent No.: US 10,366,883 B2
(45) Date of Patent: Jul. 30, 2019

(54) HYBRID MULTILAYER DEVICE (71) Applicant: HEWLETT PACKARD ENTERPRISE DEVELOPMENT LP, Houston, TX (US)

(72) Inventor: Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/324,709

(22) PCT Filed: Jul. 30, 2014

(86) PCT No.: PCT/US2014/048833
§ 371 (c)(1),
(2) Date: Jan. 8, 2017

(87) PCT Pub. No.: WO2016/018288
PCT Pub. Date: Feb. 4, 2016

(65) Prior Publication Data
US 2017/0213729 A1    Jul. 27, 2017

(51) Int. Cl.
*H01S 5/00* (2006.01)
*H01L 21/02* (2006.01)
(Continued)

(52) U.S. Cl.
CPC .. *H01L 21/02636* (2013.01); *H01L 21/02381* (2013.01); *H01L 21/02387* (2013.01);
(Continued)

(58) Field of Classification Search
CPC ......... H01L 21/02636; H01L 21/02381; H01L 21/02387; H01L 21/30604;
(Continued)

(56) References Cited

U.S. PATENT DOCUMENTS 4,408,330 A    10/1983  An
5,294,808 A     3/1994  Lo
(Continued)

FOREIGN PATENT DOCUMENTS

CN    1476132 A    2/2004
CN    101467083 A   6/2009
(Continued)

OTHER PUBLICATIONS

Google search (hybrid laser, waveguide, substrate) pp. 1-2.*
(Continued)

*Primary Examiner* — Jessica S Manno
*Assistant Examiner* — Delma R Fordé
(74) *Attorney, Agent, or Firm* — Hewlett Packard Enterprise Patent Department (57) ABSTRACT

A multilayer device includes a substrate and a first layer disposed on the substrate. A trench extends through one or both of the substrate and the first layer. The trench has a first sidewall spaced apart from a second sidewall, each sidewall extending from an upper surface of the substrate to a lower surface of the first layer. An optically active region is disposed on the first layer overlying the trench, such that at least a portion of the optically active region is located within a set of lines corresponding to the sidewalls of the trench.

20 Claims, 5 Drawing Sheets

(51) Int. Cl.
| | |
|---|---|
| *H01L 21/764* | (2006.01) |
| *H01L 21/306* | (2006.01) |
| *H01L 31/0304* | (2006.01) |
| *H01S 5/02* | (2006.01) |
| *H01S 5/323* | (2006.01) |
| *H01L 31/102* | (2006.01) |

(52) U.S. Cl.
CPC ...... *H01L 21/30604* (2013.01); *H01L 21/764* (2013.01); *H01L 31/0304* (2013.01); *H01L 31/102* (2013.01); *H01S 5/021* (2013.01); *H01S 5/323* (2013.01); *H01L 2924/0002* (2013.01); *H01S 2301/173* (2013.01); *H01S 2304/00* (2013.01)

(58) Field of Classification Search
CPC ............. H01L 21/02367; H01L 21/762; H01L 21/76205; H01L 21/76232; H01L 21/76264; H01L 31/0304; H01L 27/1203; H01L 27/1207; H01L 27/10823; H01L 27/10829; H01L 25/16; H01L 25/167; H01S 5/021; H01S 5/323; H01S 5/0206; H01S 5/0215; H01S 5/2235; H01S 5/2234; H01S 3/0637; H01S 3/2375
See application file for complete search history.

(56) References Cited

U.S. PATENT DOCUMENTS

| | | | |
|---|---|---|---|
| 5,512,375 A | 4/1996 | Green et al. | |
| 5,764,670 A | 6/1998 | Ouchi | |
| 5,883,009 A | 3/1999 | Villa et al. | |
| 5,981,400 A | 11/1999 | Lo | |
| 6,288,426 B1 | 9/2001 | Gauthier et al. | |
| 6,437,372 B1 | 8/2002 | Geva et al. | |
| 6,475,873 B1* | 11/2002 | Kalnitsky | H01L 27/0802 |
| | | | 257/359 |
| 6,492,283 B2 | 12/2002 | Raaijmakers et al. | |
| 6,493,476 B2 | 12/2002 | Bendett | |
| 6,515,333 B1 | 2/2003 | Riccobene | |
| 6,526,083 B1 | 2/2003 | Kneissl et al. | |
| 6,585,424 B2 | 7/2003 | Chason et al. | |
| 6,705,681 B2 | 3/2004 | Russ | |
| 6,706,581 B1 | 3/2004 | Hou et al. | |
| 6,849,866 B2 | 2/2005 | Taylor | |
| 6,902,987 B1 | 6/2005 | Tong et al. | |
| 7,087,452 B2 | 8/2006 | Joshi et al. | |
| 7,217,584 B2 | 5/2007 | Yue et al. | |
| 7,231,123 B2 | 6/2007 | Sugita et al. | |
| 7,368,816 B2 | 5/2008 | Lim et al. | |
| 7,560,361 B2 | 7/2009 | Frank et al. | |
| 7,579,263 B2 | 8/2009 | Han et al. | |
| 7,639,719 B2 | 12/2009 | Fang et al. | |
| 7,817,881 B2 | 10/2010 | Li | |
| 7,838,314 B2 | 11/2010 | Choi et al. | |
| 7,869,473 B2 | 1/2011 | Ye et al. | |
| 7,935,559 B1 | 5/2011 | Giffard et al. | |
| 7,949,210 B2 | 5/2011 | Durfee et al. | |
| 8,078,018 B2 | 12/2011 | Mouli | |
| 8,106,468 B2 | 1/2012 | Wang et al. | |
| 8,344,453 B2 | 1/2013 | Muller | |
| 8,372,673 B2 | 2/2013 | Lee et al. | |
| 8,488,917 B2 | 7/2013 | Manipatruni et al. | |
| 8,502,279 B2 | 8/2013 | Toh et al. | |
| 8,538,206 B1 | 9/2013 | Fish et al. | |
| 8,664,087 B2 | 3/2014 | Chang et al. | |
| 8,716,852 B2 | 5/2014 | Shu et al. | |
| 8,937,981 B2 | 1/2015 | Liang | |
| 9,018,675 B2 | 4/2015 | Bedell et al. | |
| 9,059,252 B1 | 6/2015 | Liu et al. | |
| 9,093,428 B2 | 7/2015 | Liang | |
| 9,110,314 B2 | 8/2015 | Tu et al. | |
| 9,240,406 B2 | 1/2016 | Feng et al. | |
| 9,269,724 B2 | 2/2016 | Han et al. | |
| 9,509,122 B1* | 11/2016 | Norberg | H01S 5/3211 |
| 9,570,351 B2* | 2/2017 | Liang | H01L 21/78 |
| 9,640,531 B1 | 5/2017 | Or-Bach et al. | |
| 9,773,906 B2 | 9/2017 | Wang et al. | |
| 2002/0081793 A1 | 6/2002 | Yang et al. | |
| 2002/0094661 A1* | 7/2002 | Enquist | H01L 21/2007 |
| | | | 438/455 |
| 2002/0113288 A1 | 8/2002 | Clevenger et al. | |
| 2002/0121337 A1 | 9/2002 | Whatmore et al. | |
| 2002/0168837 A1 | 11/2002 | Hsu et al. | |
| 2003/0006407 A1 | 1/2003 | Taylor | |
| 2003/0025976 A1 | 2/2003 | Wipiejewski | |
| 2003/0081642 A1 | 5/2003 | Hwang et al. | |
| 2003/0134446 A1 | 7/2003 | Koike et al. | |
| 2003/0203550 A1 | 10/2003 | Lai et al. | |
| 2004/0028092 A1 | 2/2004 | Kim | |
| 2004/0081386 A1 | 4/2004 | Morse et al. | |
| 2004/0152272 A1 | 8/2004 | Fladre et al. | |
| 2004/0184502 A1* | 9/2004 | Miyachi | B82Y 20/00 |
| | | | 372/50.1 |
| 2004/0248334 A1 | 12/2004 | Hoss et al. | |
| 2004/0257171 A1 | 12/2004 | Park et al. | |
| 2004/0264530 A1 | 12/2004 | Ryou et al. | |
| 2005/0081958 A1 | 4/2005 | Adachi et al. | |
| 2005/0106790 A1 | 5/2005 | Cheng et al. | |
| 2005/0139857 A1 | 6/2005 | Shin | |
| 2005/0207704 A1 | 9/2005 | Keyser et al. | |
| 2006/0035450 A1 | 2/2006 | Frank et al. | |
| 2006/0063679 A1 | 3/2006 | Yue et al. | |
| 2006/0181542 A1 | 8/2006 | Granger et al. | |
| 2007/0275505 A1 | 11/2007 | Wolterink et al. | |
| 2008/0012145 A1 | 1/2008 | Jang | |
| 2008/0018983 A1 | 1/2008 | Ishii et al. | |
| 2008/0175294 A1* | 7/2008 | Kim | B82Y 20/00 |
| | | | 372/45.011 |
| 2008/0283877 A1 | 11/2008 | Collonge et al. | |
| 2009/0080488 A1 | 3/2009 | Hatakeyama et al. | |
| 2009/0101997 A1 | 4/2009 | Lammel et al. | |
| 2009/0110342 A1 | 4/2009 | Webster et al. | |
| 2009/0168821 A1 | 7/2009 | Fang et al. | |
| 2009/0194152 A1 | 8/2009 | Liu et al. | |
| 2009/0200636 A1 | 8/2009 | Edelstein et al. | |
| 2009/0242935 A1 | 10/2009 | Fitzgerald | |
| 2009/0263076 A1 | 10/2009 | Mathai et al. | |
| 2009/0302415 A1 | 12/2009 | Mueller et al. | |
| 2010/0060970 A1 | 3/2010 | Chen | |
| 2010/0098372 A1 | 4/2010 | Manipatruni et al. | |
| 2010/0119231 A1* | 5/2010 | Kim | G02B 6/1221 |
| | | | 398/82 |
| 2010/0140629 A1 | 6/2010 | Lee et al. | |
| 2010/0140739 A1 | 6/2010 | Kim | |
| 2010/0215309 A1 | 8/2010 | Shubin et al. | |
| 2010/0295083 A1 | 11/2010 | Celler | |
| 2011/0045644 A1 | 2/2011 | Barth et al. | |
| 2011/0064099 A1 | 3/2011 | Govorkov et al. | |
| 2011/0073989 A1 | 3/2011 | Rong et al. | |
| 2011/0176762 A1 | 7/2011 | Fujikata et al. | |
| 2011/0180795 A1 | 7/2011 | Lo et al. | |
| 2011/0211786 A1 | 9/2011 | Ushida et al. | |
| 2011/0293216 A1 | 12/2011 | Lipson et al. | |
| 2012/0002285 A1 | 1/2012 | Matsuda | |
| 2012/0008658 A1 | 1/2012 | Chung | |
| 2012/0119258 A1 | 5/2012 | Liang | |
| 2012/0189239 A1 | 7/2012 | Tu et al. | |
| 2012/0257850 A1 | 10/2012 | Fujikata et al. | |
| 2013/0009182 A1 | 1/2013 | Jung et al. | |
| 2013/0009321 A1 | 1/2013 | Kagawa et al. | |
| 2013/0029449 A1 | 1/2013 | Cheng et al. | |
| 2013/0049203 A1 | 2/2013 | Ahrens et al. | |
| 2013/0063226 A1 | 3/2013 | Burak et al. | |
| 2013/0147021 A1 | 6/2013 | Puurunen et al. | |
| 2013/0155484 A1 | 6/2013 | Sweatlock et al. | |
| 2013/0168776 A1* | 7/2013 | Liang | H01L 21/823871 |
| | | | 257/369 |
| 2014/0141546 A1 | 5/2014 | Cho | |
| 2014/0177994 A1 | 6/2014 | Chen | |
| 2014/0264723 A1 | 9/2014 | Liang et al. | |

(56) References Cited

U.S. PATENT DOCUMENTS

| | | | |
|---|---|---|---|
| 2014/0307997 | A1* | 10/2014 | Bar .................... H01L 21/8258 385/14 |
| 2015/0055910 | A1 | 2/2015 | Liang |
| 2015/0069418 | A1 | 3/2015 | Heo et al. |
| 2015/0140720 | A1 | 5/2015 | Collins |
| 2015/0144928 | A1 | 5/2015 | Forrest et al. |
| 2015/0177458 | A1 | 6/2015 | Bowers et al. |
| 2015/0179447 | A1 | 6/2015 | Ryou |
| 2015/0212266 | A1 | 7/2015 | Czornomaz et al. |
| 2016/0094014 | A1* | 3/2016 | Shin .................... H01S 5/2031 372/45.01 |
| 2016/0126381 | A1* | 5/2016 | Wang .............. H01L 31/035227 257/429 |
| 2016/0238860 | A1* | 8/2016 | Liang .................... H01S 5/026 |
| 2017/0077325 | A1* | 3/2017 | Norberg ................ H01S 5/3211 |
| 2017/0146740 | A1* | 5/2017 | Orcutt .................... G02B 6/136 |
| 2017/0358607 | A1* | 12/2017 | Balakrishnan ...... H01L 27/1207 |

FOREIGN PATENT DOCUMENTS

| | | |
|---|---|---|
| CN | 100514099 C | 7/2009 |
| CN | 102314057 B | 5/2014 |
| EP | 2146243 A1 | 1/2010 |
| JP | 2005-093742 A | 4/2005 |
| JP | 2010-278396 A | 12/2010 |
| WO | 2013/066318 A1 | 5/2013 |
| WO | 2013/165376 A1 | 11/2013 |
| WO | 2014/021781 A1 | 2/2014 |
| WO | 2014/209398 A1 | 12/2014 |
| WO | 2016/018285 A1 | 2/2016 |
| WO | 2016/122547 A1 | 8/2016 |

OTHER PUBLICATIONS

Masahiro Yanagisawa et al. "Film-Level hybrid integration of AlGaAs laser diode with glass waveguide on Si substrate" IEEEPhotonics Technology Letters, vol. 4, No. 1, Jan. 1992, pp. 21-23.*

Youngho Jung et al. "Hybrid integration of III-V semiconductor lasers on silicon waveguides using optofluidic microbubble manipulation" Scientific Reports www.nature.com/scientificreports, published Jul. 19, 2016, pp. 1-7.*

Zhiping Zhou et al. "On-chip light sources for silicon photonics" Light: Science & Applications, www.natrure.com/lsa Aug. 5, 2015, pp. 1-13.*

Xianshu Luo et al. "High-throughput multiple dies-to-wafer bonding technology and III/V-on-Si hybrid laser for heterogeneous integration of optoelectronic integrated circuits" www.Frontiersin. org published Apr. 7, 2015, pp. 1-22.*

Alexander W. Fang "Electrically pumped hybrid AlGaInAs-silicon evanescent laser" Optical Society of America, Oct. 2, 2016/vol. 14, No. 20/Optics Express, pp. 9203-9210.*

Caglar Duman etl al. "Comparative modeling results for ridge waveguide MQW and hybrid Si/III-V lasers" Journal of radiation research and applied sciences, Nov. 17, 2017, pp. 1-5.*

Hirakawa, K. et al., High Resolution Subpixel and Subframe Rendering for Color Flatpanel and Projector Displays, 2011 18th IEEE International Conference, Sep. 11-14, 2011, pp. 1725-1728.

PCT/ISA/KR, International Search Report, dated Apr. 29, 2015, PCT/US2014/048833, 11 pages.

Yu Xia, "Tetracene air-gap single-crystal field-effect transistors." Applied Physics Letters 90, 162106, 2007, 3 pages, <http://rogers.matse.illinois.edu/files/2007/tetraceneapl.pdf>.

Y. Tang et al., Optics Express, Mar. 28, 2011, vol. 9, No. 7, pp. 5811-5816.

Xiaonan Chen et al., "Active Transmission Control Based on Photonic-Crystal MOS Capacitor," Photonic Crystal Materials and Devices VI, Jan. 23, 2007, Proc. of SPIE vol. 6480 pp. 1-9.

Sysak, M. N. et al., "Hybrid Silicon Laser Technology: A Thermal Perspective," Selceted Topics in Quantum Electronics, IEEE Journal of 17.6, 2011, pp. 1490-1498, available at http://optoelectronics.ece.ucsb.edu/sites/default/files/publications/1195_Sysak_JSTQ_2011J.pdf.

Supplementary European Search Report and Search Opinion Received for EP Application No. 12875835.6, dated Feb. 18, 2016, 14 pages.

Partial Supplementary European Search Report received in EP Application No. 12875835.6, dated Oct. 11, 2015, 6 pages.

Martijn J.R. Heck et ,al., "Hybrid Silicon Photonics for Optical Interconnects," IEEE Journal of Selected Topics in Quantum Electronics, Aug. 13, 2010, pp. 1-14.

Liang, D., "III-V-on-Silicon Hybrid Integration, Materials, Devices, and Applications," IEEE Winter Topicals, 2011, pp. 151-152.

Liang et al, "Highly efficient vertical outgassing channels for low-temperature InP-to-silicon direct wafer bonding on the silicon-on-insulator substrate"; 2008; pp. 1560-1568.

Liang D et al: "Optimization of Hybrid Silicon Microring Lasers", IEEE Photonics Journal, IEEE, USA, vol. 3, No. 3, Jun. 28, 2011 (Jun. 28, 2011), pp. 580-587.

Li, J., "Wafer Scale Fiexible Interconnect Fabrication for Heierogeneous Integration," (Doctoral Dissertation), TU Delft, Deifl University of Techniogy, Oct. 26, 2015, 94 pages.

Kuldeep Amarnath, "Active Microring and Microdisk Optical Resonators on Indium Phosphide," Dissertation, 2006, pp. 1-163, Available at: <drum.lib.umd.edu/bitstream/1903/3513/1/umi-umd-3343.pdf>.

Kissinger et al., "Void-free silicon-wafer-bond strengthening in the 200-400 C range", Sens. Actuators. A 36, 1993, pp. 149-156.

International Search Report and Written Opinion received for PCT Patent Application No. PCT/US2015/048365, dated May 30, 2016, 11 pages.

International Search Report and Written Opinion received for PCT Patent Application No. PCT/US2014/048818, dated Apr. 22, 2015, 11 pages.

International Search Report and Written Opinion received for PCT Patent Application No. PCT/US2012/035893, dated Dec. 26, 2012, 8 pages.

International Search Report and Written Opinion received for PCT Patent Application No. PCT/US2011/058756, dated Aug. 27, 2012, 6 pages.

International Search Report and Written Opinion received for PCT Patent Application No. PCT/US2011/050083, dated May 1, 2012, 7 pages.

International Search Report and Written Opinion received for PCT Patent Application No. PCT/US16/24823, dated Dec. 26, 2016, 10 pages.

International Search Report and Written Opinion received for PCT Application No. PCT/US2016/013605, dated Oct. 13, 2016, 10 pages.

International Preliminary Report on Patentability received for PCT Patent Application No. PCT/US2015/048365, dated Mar. 15, 2018, 10 pages.

International Preliminary Report on Patentability received for PCT Patent Application No. PCT/US2014/048833, dated Feb. 9, 2017, 7 pages.

International Preliminary Report on Patentability received for PCT Patent Application No. PCT/US2014/048818, dated Feb. 9, 2017, 10 pages.

International Preliminary Report on Patentability received for PCT Patent Application No. PCT/US2011/058756, dated May 15, 2014, 5 pages.

International Preliminary Report on Patentability received for PCT Patent Application No. PCT/US2011/050083, dated Mar. 13, 2014, 6 pages.

International Preliminary Report on Patentability received for PCT Patent Application No. PCT/US16/24823, dated Oct. 11, 2018, 9 pages.

International Preliminary Report on Patentability received for PCT Application No. PCT/US2016/013605, dated Jul. 26, 2018, 9 pages.

International Preliminary Report on Patentability received for PCT Application No. PCT/US2012/035893, dated Nov. 13, 2014, 7 pages.

(56) References Cited

OTHER PUBLICATIONS

Haataja, M. et al.; "Dislocations and Morphological Instabilities: Continuum Modeling of Misfitting Heteroepitaxial Films"; Apr. 5, 2002; 20 pages.
Gosh, S., et al; "Investigations on Thermal Stress Relief Mechanism Using Air-gapped Sio2 Nanotemplates During Epitaxial Growth of Ge on Si and Corresponding Hole Mobility Improvement"; Apr. 20, 2012; 4 pages.
Gosh, S., et al; "Experimental and Theoretical Investigation of Thermal Stress Relief During Epitaxial Growth of Ge on Si Using Air-gapped Sio2 Nanotemplates"; Oct. 2011; 9 pages.
European Search Report and Search Opinion Received for EP Application No. 11875113.0, dated Jul. 30, 2015, 3 pages.
European Search Report and Search Opinion Received for EP Application No. 11871524.2, dated Jul. 16, 2015, 8 pages.
Delphine Marris-Morini et al., "D006—State of the art on Photonics on CMOS," Nov. 30, 2009, pp. 1-70, Available at: <helios-project.eu/content/download/326/2147/file/HELIOS.sub.-D006.pd-f>.
Basak, J. et al., Developments in Gigascale Silicon Optical Modulators Using Free Carrier Dispersion Mechanisms, Apr. 15, 2008, Advances in Optical Technologies, vol. 2008, 10 pages.
Ansheng Liu et al, "A High-Speed Silicon Optical Modulator Based on a Metal-Oxide-Semiconductor Capacitor," Nature-427, Feb. 12, 2004, Nature Publishing Group, pp. 615-618.
Impact of Interfacial Layer and Transition Region on Gate Current Performance for High-K Gate Dielectric Stack: Its Trade off With Gate Capacitance, (Research Paper), Electron Devices, IEEE Transacfons on 50.2, Mar. 2003, pp. 433-439.

\* cited by examiner

HYBRID MULTILAYER DEVICE

BACKGROUND

Heteroepitaxy is epitaxy performed with materials that have different physical properties. Silicon (Si) has become a widely used semiconductor, in particular for microelectronic systems. As Si does not emit photons efficiently, heteroepitaxial growth of optical gain materials, e.g., III-V compound semiconductors, directly on a Si substrate has been a goal for both industry and academia. However, heteroepitaxial growth of III-V compound semiconductors on Si can result in a number of detrimental defects, such as threading dislocations, due to lattice and/or thermal mismatch. The dislocations originate at the III-V/Si growth interface and can propagate into the optical gain material toward the active region, tending to reduce the life and performance of the system.

DETAILED DESCRIPTION

This disclosure relates to a hybrid multilayer device and methods to fabricate a hybrid substrate, such can enable high-quality heteroepitaxy. As an example, the device can include a substrate and a first layer disposed on the substrate. A trench can extend through (e.g., partially or completely) one or both of the substrate and the first layer. The trench has respective sidewalls spaced apart from each other that extend between opposed surfaces, which surfaces correspond to layers of the substrate and the first layer. For example, the trench is dimensioned and configured such that the distance between the sidewalls (e.g., its width) is greater than a distance (e.g., its height) between the surfaces between which the sidewalls extend. An optically active region resides (e.g., is formed or otherwise attached) on the first layer overlying the trench, such that at least a portion of the optically active structure is located in overlying relationship within a boundary defined by the sidewalls of the trench. In some examples a wafer bonding process can be used to affix a template, corresponding to the first layer, onto the substrate with a shallow trench. Heteroepitaxy can be employed to create a free-standing, defect-free region for a variety of heterogeneous devices, such as the optically active region.

As used herein, heteroepitaxy (e.g., monolithic integration) refers to a technique to integrate different materials in layers for specific functions and enhanced device performance. In heteroepitaxy, a crystalline film is applied to a crystalline substrate or film of a different material. This technology is often used to fabricate integrated crystalline layers of different materials, for example, in fabrication of a multilayer integrated circuit.

Figure 1:
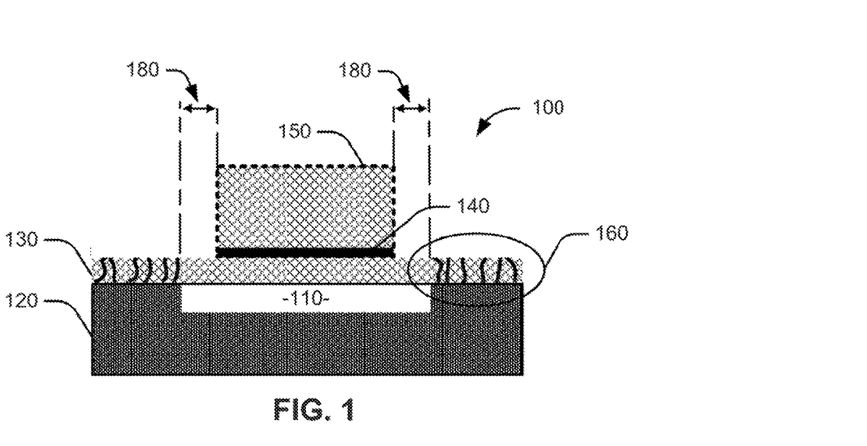
FIG. 1 illustrates an example of a hybrid multilayer device.

FIG. 1 illustrates a hybrid multilayer device 100 that can substantially eliminate defects associated with lattice and/or thermal mismatch in an area on the layered device corresponding to, for example, an active region. In the example of FIG. 1, substrate 120 is provided with a trench 110 formed by, for example, lithography and etching. Depending on the desired application, the trench 110 can be straight, curved, or other useful shape. The trench can be formed in the substrate 120 and/or in an adjacent layer that is fixed to the substrate. The substrate 120 can be made from, for example, Si, sapphire, germanium, gallium compounds or other suitable materials. A first layer 130 is disposed above the substrate 120, such that substrate 120 and first layer 130 make contact on both sides of the trench 110 yet no contact is made between layers surrounding the trench 110. The layer 130 can be a III-V compound semiconductor. By the above configuration in the device 100, defects (characterized by non-uniform lines) designated by 160, can be limited to interfacial regions between substrate 120 and first layer 130 outside of the region defined by the spatial boundary of the trench. Thus, a freestanding region 150 is disposed on first layer 130 in an overlying relationship within the opposed sidewalls of trench 110. In the example of FIG. 1, the region 150 can be spaced apart from the trench sidewall boundaries, demonstrated by distance 180, such that the region is placed away from defects 160. In other examples, a portion of the freestanding region can extend beyond the trench sidewall boundaries, as a substantial portion of the active region remains within the trench sidewall boundaries, as shown in FIG. 2.

As shown in the example of FIG. 1, the area where substrate 120 and first layer 130 are in direct contact (e.g., the interfacial region) may form some dislocation defects 160. However, the freestanding region 150 overlaying the trench 110 will remain substantially defect-free. As additional layers may be provided, e.g., epitaxial growth providing active layer 140 to enable photonic devices, defects 160 may propagate upward into first layer 130 and through the junction where the substrate 120 and first layer 130 make contact. Certain types of electrical circuitry (e.g., transistors, terminals, conductors, etc.) can be fabricated to operate without issue even with ingrowth of such defects. An active heterogeneous device can be integrated over the region 150 away from possible defects 160. Further, first layer 130 may be formed with a trench to enhance the trench 110 within substrate 120 or eliminate the need for the substrate 120 to contain a trench altogether.

Figure 2:
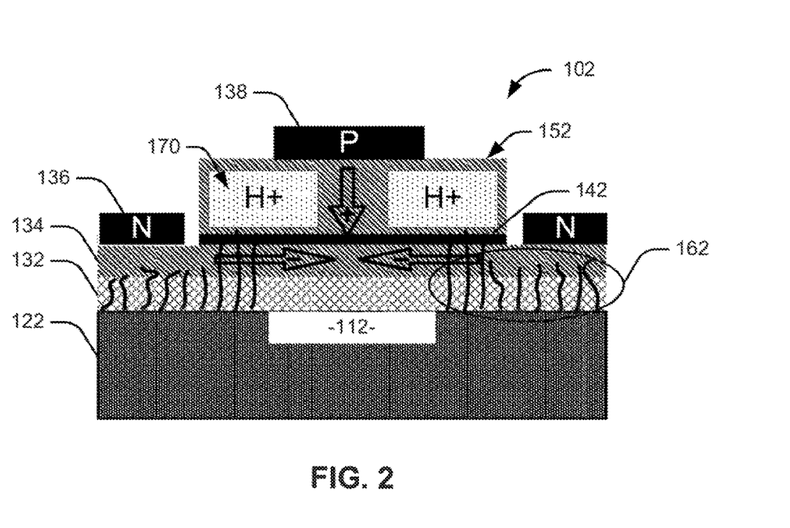
FIG. 2 illustrates another example of a hybrid multilayer device.

FIG. 2 illustrates another example hybrid multilayer device 102, e.g., a laser, that can substantially eliminate defects associated with lattice and/or thermal mismatch in a layered device. In the example of FIG. 2, substrate 122 is provided with a trench 112 that can be formed in a manner similar to trench 110 described with respect to FIG. 1. A first layer 132 is disposed above the substrate 122, with one or more layers 134 disposed thereon. The layers 132 and 134 can be, for example, a III-V compound semiconductor. Defects characterized by non-uniform lines designated by 162, can be substantially limited to interfacial regions between substrate 122 and first layer 132 outside of the region defined by the spatial boundary of the trench.

In the example of FIG. 2, a III-V compound semiconductor mesa 152 can be formed with physical boundaries that extend beyond the trench sidewall boundaries, such that a central portion of the mesa 152 is located away from defects 162. In this example, a device that is incorporated with mesa 152 can benefit from a defect-free active region even though the physical width of the mesa 152 is larger than trench 112 below. The device is able to operate substantially free from defects in this arrangement by including a region 170, designated with an "H+", as a proton implanted region that is substantially electrically resistant (e.g., high impedance). As a result, injected carriers will not pass through region 170 but be forced to flow through a path of lower electrical resistance. The path followed by the injected carriers is depicted as a bold arrow with a "+" flowing from a p-junction 138 and directed toward an active layer 142.

In the example of FIG. 2, portions of region 170 are located above the interface of the substrate 122 and first layer 132. Thus, as portions of the mesa 170 are directly over the interface, dislocations 162 can potentially propagate into the mesa 152. However, the region 170 confines the flow of injected carriers to a central portion of the mesa 152, away from possible dislocations. Therefore, the injected carriers recombine with carriers from n-junctions 136 at a location toward the center of the mesa 152, as depicted by bold arrows with a "−". The injected carriers then emit photons in a concentrated region at the center of the mesa 152, mitigating possible interference from defects 162. In other words, provided that the flow of the injected carriers is directed to a portion of the mesa 170 that lies above the trench 112, device operation may not be adversely affected by possible dislocations 162. Accordingly, a hybrid multilayer device may have an area with lateral dimensions within the sidewall boundary of the trench below, as illustrated in FIG. 1, can have lateral dimensions similar to the trench below, or can have lateral dimensions that extend beyond the sidewall boundary of the trench below, as illustrated in FIG. 2.

In view of the foregoing structural and functional features described above, example methods of making a hybrid multilayer device (e.g., the device 100 of FIG. 1) will be better appreciated with reference to FIGS. 3-14. In the examples of FIGS. 3-14, various types of process parameters can be utilized at various steps according to application requirements and the structures being fabricated and materials used in such fabrication. While, for purposes of simplicity of explanation, the methods of FIGS. 3-14 are shown and described as executing serially, the methods are not limited by the illustrated order, as some actions could in other examples occur in different orders and/or concurrently from that shown and described herein.

FIGS. 3-9 describe one example of a method to fabricate a hybrid multilayer device (e.g., corresponding to the device 100). The method described in FIGS. 3-9 can combine a wafer bonding process with heteroepitaxy to result in a hybrid multilayer device with a free-standing region above the substrate that is and remains substantially defect free. Compared to heteroepitaxy, the wafer bonding process does not require a substantial lattice match between two layers. Further, wafer bonding can be a less complex and costly process than traditional heteroepitaxy. In the described example method of FIGS. 3-9, although defects due to lattice match are substantially eliminated, modest thermal expansion cannot be ignored as strong wafer bonding may require elevated temperatures to properly anneal the bonding agent for attaching the respective layers. Thus, in this example, the wafer bonding process is combined with a trench upon which the active region rests in order to avoid thermal defects at the bonding interface.

Figure 3:
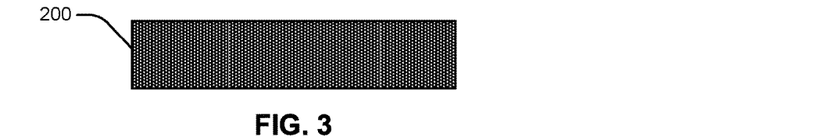
FIGS. 3 to 9 illustrate an example method that can be employed to manufacture a hybrid multilayer device.
Figure 4:
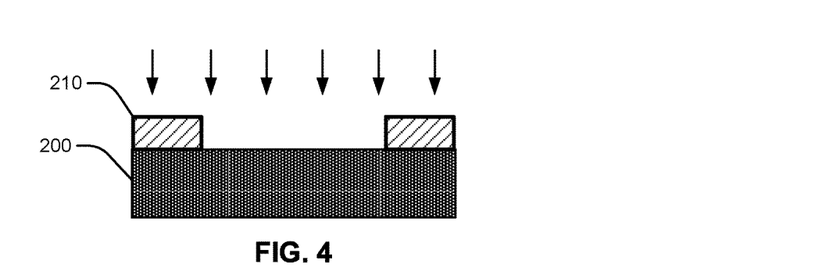
Figure 5:
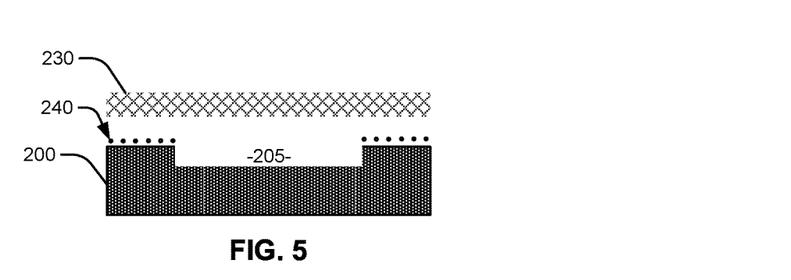

FIG. 3 provides a substrate 200, e.g., corresponding to the substrate 120 of FIG. 1. FIG. 4 illustrates the substrate 200 subject to an etching process in order to create at least a portion of a trench. For example, a photoresist 210 or other masking material can be used to define the dimensions of a trench 205, as shown in FIG. 5. The photoresist 210 may be formed over the substrate 200 via conventional spin-coating or spin casting deposition techniques. For example, photoresist 210 is patterned using conventional techniques to form a mask for the trench 205. That is, the patterned photoresist 210 can serve as an etch mask layer for processing or etching the underlying silicon substrate 200. For example, the trench can be formed via etching, such as a reactive ion etching (RIE). For example, a silicon substrate can be anisotropically etched with one or more plasma gases, such as carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of a patterned photoresist layer. The trench 205 can be dimensioned and configured to have a width that is greater than a depth of the device. In some examples, the trench can extend completely through the substrate layer include a plurality of elongate sections formed in the substrate 200 via one or more similar etching processes.

Subsequent to the etching process, the first layer 230 is bonded to the substrate 200 by a bonding agent 240, resulting in the layered structure shown in FIG. 5. The wafer-bonding step can include hydrophobic, hydrophilic, polymer, metal bonding, or the like.

Figure 6A:
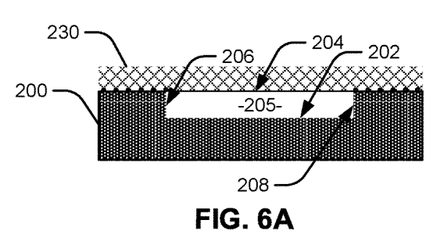
Figure 6B:
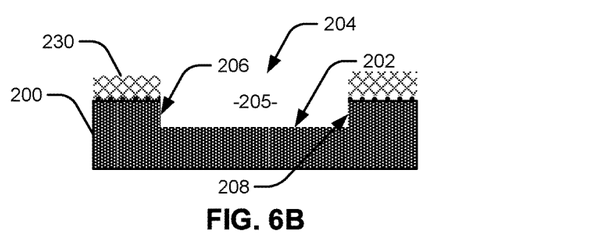

In some examples the trench 205 can be wholly formed in the substrate. As illustrated in FIG. 6A, the trench 205 can be defined by sidewalls 206 and 208 that extend from a surface 202 within the substrate 200 and terminate in an adjacent surface 204 of the first layer 230. As illustrated in FIG. 6B, the trench 205 can be partially the trench 205 can be partially formed in the layer 230 and partially formed in the layer 230 and partially formed in the substrate 200 such that the sidewalls of the trench are aligned as the layers 200 and 230 are bonded together as to form continuous sidewalls for the trench. In yet another example, the trench 205 can be formed wholly within the first layer 230, bounded by the adjacent surface of the substrate 200 (e.g., the surface to which the layer 230 is bonded.

Although demonstrated as substantially parallel, the sidewalls 206 and 208 may be at an angle relative to each other. Thus, one or both of the sidewalls 206 and 208 may be perpendicular to the surface 202 of the substrate and the surface 204 of the first layer 230, as demonstrated, or each of the sidewalls 206 and 208 may be at another angle. Moreover, each of the sidewalls 206 and 208 may have the same or different angle relative to the surface 202 of the substrate 200 and the surface 204 of the first layer 230 or may have different angles and/or orientation. The trench 205 can be etched to have a smooth or textured surface and may include planar surfaces or the surfaces, in other examples, could be curved.

Figure 7:
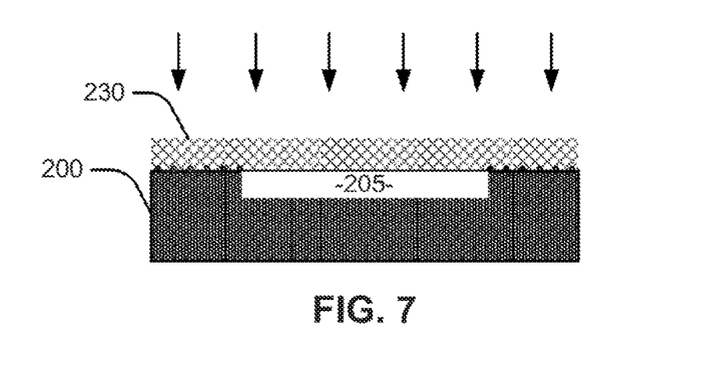
Figure 8:
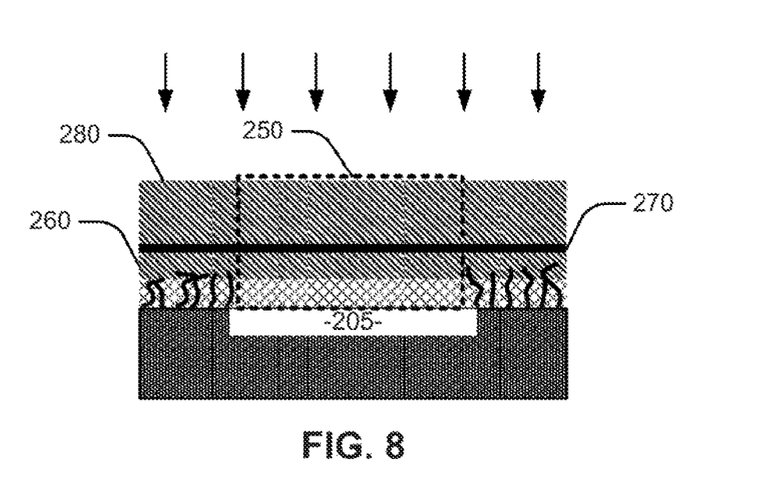

In FIG. 7, epitaxial growth or the like can be employed to fabricate additional layers of one or more active structures that are built upon first layer 230. Fabrication can, for example, be performed by applying appropriate deposition and/or etching techniques to a stack of materials (e.g., III-V semiconductor compound materials), although the examples described are not limited to these techniques. For example, fabrication can include epitaxially growing a stack of materials (e.g., III-V semiconductor compound materials). Epitaxial growth is a technique that can be used to fabricate various electronic and optical devices. Such devices can have a complicated structure, which may be formed from a number of thin layers with various compositions. Fabrication can, for example, include utilizing electronbeam lithography to etch predetermined variations in the structure. In fabricating the hybrid multilayer device, the layered material may have lattice and thermal characteristics that approach the characteristics of a device active region. In other words, first layer 230 can provide a template for additional heteroepitaxial growth for one or more specific devices (e.g., photodetector, laser, modulator, amplifier, photonic integrated circuits, etc.). Fabrication can, in various examples, include the stack of materials being processed to form a compact monolithic photonics platform by forming subsequent layers on the first layer (e.g., via epitaxial growth, among other appropriate techniques for forming a monolithic, integrated structure). As shown in FIG. 8, one or more additional layers 260 can be grown (or otherwise fabricated) upon first layer 230, such as followed by one or more active layer 270, and one or more subsequent layers 280. The resulting structure provides for an active device structure in a freestanding region 250, designated by a dotted line, in overlying relationship with the trench. For instance, the active device structure in the region 250 can reside within lateral boundaries defined by sidewalls of the trench 205. The freestanding region 250 is therefore spatially spaced apart from the interfacial region between the substrate 200 and first layer 230, as well as any constituent defects that might occur in the interfacial region. A device mesa can be formed in the freestanding region 250 by an etching process. Regrowth of the layered material is conducted to passivate the etched interface to make high-performance photonic components and integrated circuits.

Figure 9:
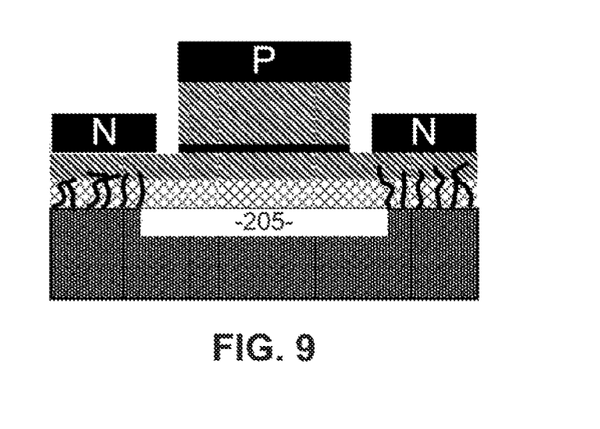

Additional epitaxial growth and/or lithographic techniques can be applied to result in a hybrid multilayer device, which can include one or more p-n junctions, such as shown in FIG. 9. Additionally, to provide for structural support, in some examples, one or more spaced apart support structures (not shown) can be constructed below the device (e.g., extending in the trench between upper and lower surfaces) to balance the mechanical forces (e.g., stress and strain) in the sealed trench chamber and outside environment.

Figure 10:
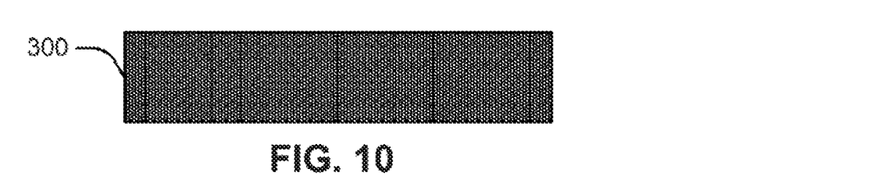
FIGS. 10 to 14 illustrate another example method that can be employed to manufacture a hybrid multilayer device.
Figure 11:
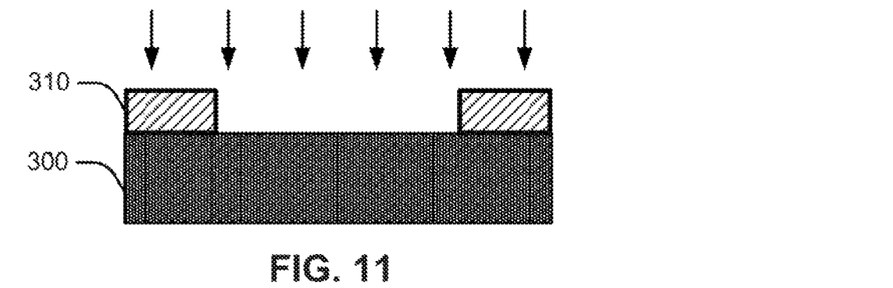
Figure 12:
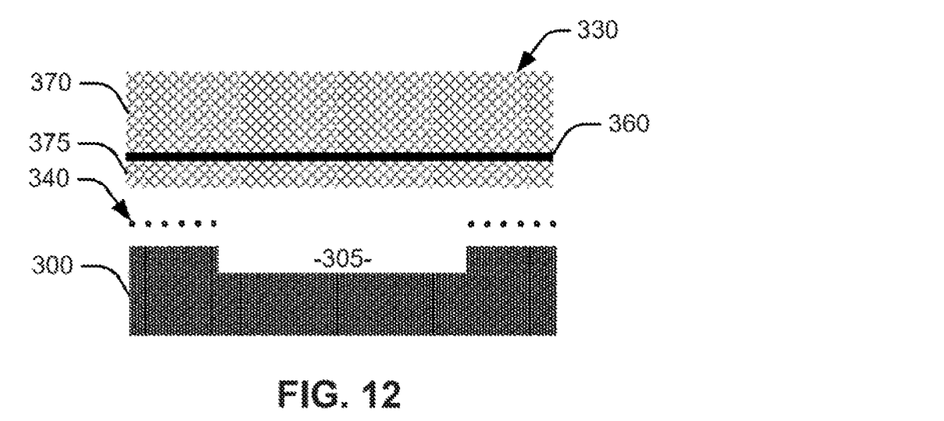
Figure 13:
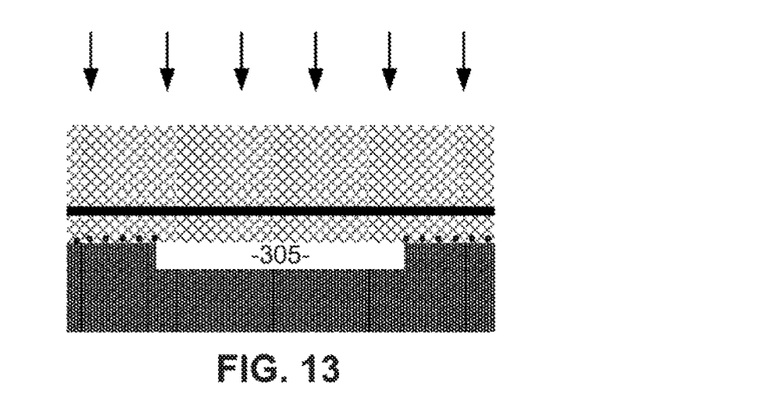
Figure 14:
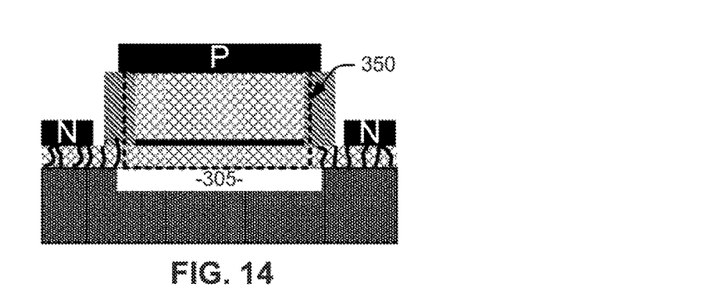

FIGS. 10-14 describe another example method of producing a hybrid multilayer device. The process described in FIGS. 10-14 also employs a wafer bonding process combined with heteroepitaxy. However, in this example, two or more layers (e.g., corresponding to at least a portion of the resulting active region) are formed together before bonding to the substrate. In FIGS. 10-11, a substrate 300 and layer of photoresist 310 are provided. Following etching, a trench 305 (or at least a portion thereof) can be formed in the substrate 300. As shown in FIG. 12, a multilayer structure 330 can be bonded to the substrate 300 by a bonding agent 340. The multilayer structure 330 can include an active region 360 and one or more layers 370, 375, for example. The resulting structure, shown in FIG. 13, can then be processed by epitaxial growth and/or other fabrication techniques (e.g., heteroepitaxy, homoepitaxy or the like). The completed hybrid multilayer device, as shown in FIG. 14, includes a substantially defect free freestanding region 350 above the trench 305, such as disclosed herein.

Figure 15:
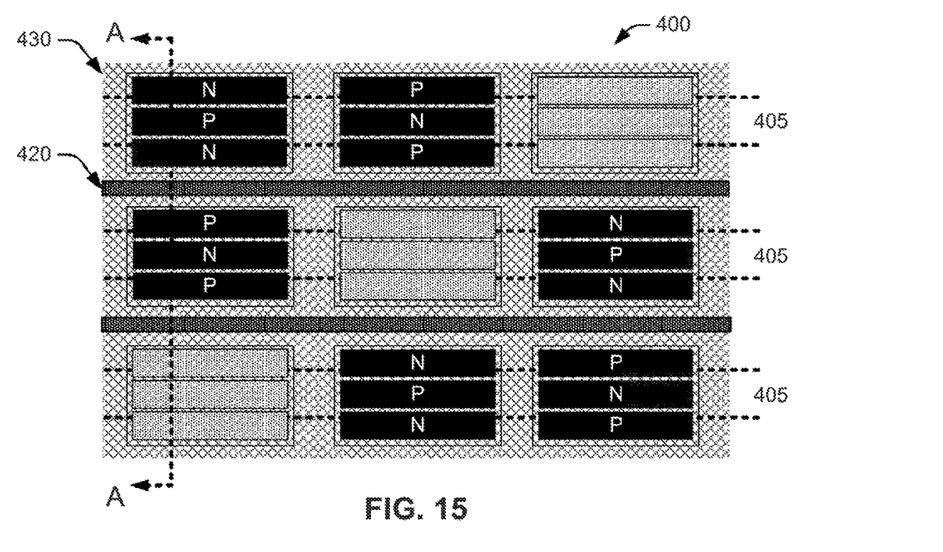
FIG. 15 illustrates an example platform including a hybrid multilayer device.

By way of further example, FIG. 15 provides plan view of a platform 400 that includes a plurality of hybrid multilayer devices that have been formed in a manner consistent with the processes described herein. The platform of FIG. 15 demonstrates a single substrate 420 with three trenches 405 extending horizontally and designated by paired dotted lines. A first layer 430 is provided above each trench for additional processing. In the example of FIG. 15, a first layer above each trench is separated from each other first layer. On top of the first layer, one or more devices can be formed. FIG. 15 shows three distinct trenches 405, with three distinct first layers, and three hybrid multilayer devices formed on each first layer above the trenches 405.

Figure 16:
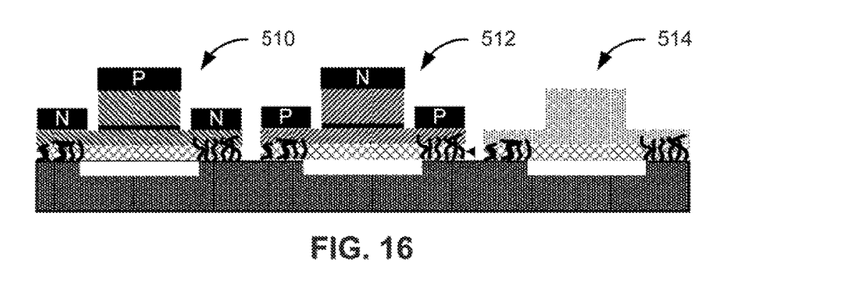
FIG. 16 illustrates a cross sectional view of the example platform of FIG. 15.

FIG. 16 provides a cross sectional view of the platform of FIG. 15, taken along line A-A of FIG. 15. The cross-sectional view of FIG. 16 illustrates three hybrid multilayer devices 510, 512, and 514, each of which is formed in accordance with the examples provided herein. The devices may be the same or a combination of different devices. As one example of FIG. 16, device 510 represents a laser, device 512 represents a photodetector, and device 514 represents a passive waveguide. However, depending on the required application, devices 510, 512, and 514 can be, for example, a laser, a photodetector, a modulator, or any other device or combination of devices. Although, the devices and process described herein are ideal for photonic applications, such as in-plane diode lasers, this process provides an attractive technique for a variety of heterogeneous devices, such as electronic, micro electrical mechanical systems (MEMS), etc.

Moreover, by the processes and hybrid devices described herein, which employs a trench formed below corresponding active regions, substantially defect-free heterogeneous devices and integration is possible, thereby enabling consistent and high quality semiconductor processing. In comparison to other attempts to create a defect-free hybrid device, wafer bonding of Si substrates with III-V compound semiconductors is relatively low-cost. Further, these methods and resulting structures can be used in the fabrication of a wide range of heterogeneous devices.

Furthermore, relative terms used to describe the structural features of the figures illustrated herein, such as above and below, up and down, first and second, near and far, etc., are in no way limiting to conceivable implementations. For instance, where examples of the structure described herein are described in terms consistent with the figures being described, and actual structures can be viewed from a different perspective, such that above and below may be inverted, e.g., below and above, or placed on a side, e.g., left and right, etc. Such alternatives are fully embraced and explained by the figures and description provided herein.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:
1. A multilayer device, comprising:
   a substrate;
   a first layer disposed on the substrate;
   a trench extending longitudinally through at least one of the substrate and the first layer, the trench having a first sidewall spaced apart from a second sidewall, each sidewall extending from a given surface of the substrate to another surface of the first layer that is spaced apart from the given surface by the first and second sidewalls; and an active region disposed on the first layer, both the active region and the first layer overlying the trench, and the first layer bonded to the substrate at locations laterally outward of the first and second sidewalls of the trench.

2. The device of claim 1, wherein the substrate comprises silicon.

3. The device of claim 1, wherein the first layer comprises a III-V compound semiconductor material.

4. The device of claim 1, wherein the sidewalls of the trench extend from a surface within the substrate and terminate in an adjacent surface of the first layer, such that the trench resides completely within the substrate bounded by the adjacent surface of the first layer.

5. The device of claim 1, wherein a portion of the trench is contained in the substrate and another portion of the trench is contained in the first layer.

6. The device of claim 5, wherein each of the first and second sidewalls of the trench comprise a substrate portion and a first layer portion, the substrate portions aligned with the first layer portions to form the first and second sidewalls, respectively.

7. The device of claim 1, wherein the multilayer device comprises one or more of a laser, a photodetector, a photointerconnect, a modulator, or a passive waveguide.

8. The device of claim 1, wherein the sidewalls of the trench extend from a surface within the first layer and terminate in an adjacent surface of the substrate, such that the trench resides completely within the first layer bounded by the adjacent surface of the substrate.

9. The device of claim 1, wherein at least a portion of the active region resides substantially within a boundary defined by the first and second sidewalls of the trench and wherein no contact is made with the substrate in a region of the trench extending longitudinally between the first and second sidewalls.

10. A method of fabricating a multilayer device, comprising:
    providing a substrate;
    bonding a structure comprising at least a first layer to the substrate;
    forming a trench in at least one of the substrate and the first layer prior to bonding the structure to the substrate, the trench including sidewalls spaced apart from each other to define a width thereof, the sidewalls extending between opposing surfaces of the substrate and the first layer to define a height, wherein the width is greater than the height, the first layer overlying the trench and bonded to the substrate at locations laterally outward of the sidewalls of the trench; and
    forming one or more layered materials on the first layer to provide an optically active region that is located overlying the trench, wherein at least a portion of the active region resides substantially within boundaries defined by the sidewalls of the trench.

11. The method of claim 10, wherein the bonding comprises one or more of of hydrophobic, hydrophilic, polymer, or metal bonding.

12. The method of claim 10, further comprising processing the first layer to form a plurality of multilayer devices, where each active region of the plurality of multilayer devices reside substantially within the boundaries defined by the sidewalls of the trench.

13. The method of claim 10, wherein the trench is formed within both of the first layer and the substrate prior to bonding the structure to the substrate.

14. A method of fabricating a multilayer device, comprising:
    etching a substrate to form at least a portion of a trench having sidewalls that are spaced apart from each other to define a width thereof that is greater than a height of the trench;
    bonding a structure to the substrate, wherein the structure includes one or more layers, the height of the trench being defined by a distance between a surface of an adjacent layer of the structure that is bonded to the substrate and a surface of the substrate that extends between the sidewalls of the trench, the adjacent layer of the structure overlying the trench and bonded to the substrate at locations laterally outward of the sidewalls of the trench; and
    forming an optically active region on the structure located in an overlying relationship with the trench such that at least a portion of the active region resides substantially within boundaries defined by the sidewalls of the trench.

15. The method of claim 14, wherein the etching includes forming more than one trench on the substrate.

16. The method of claim 15, further comprising forming a plurality of multilayer devices on the structure, where an active region of each of the plurality of multilayer devices resides substantially within the boundaries defined by the sidewalls of a respective one of the trenches.

17. The method of claim 14, wherein each of the multilayer devices comprises one or more of a laser, a photodetector, a photointerconnect, a modulator, or a passive waveguide.

18. The method of claim 14, wherein the bonding comprises one or more of hydrophobic bonding, hydrophilic bonding, polymer bonding, or metal bonding.

19. The method of claim 18, further comprising heating the multilayer device to anneal a bonding agent used in the bonding.

20. The method of claim 14, further comprising forming at least a portion of the trench within the adjacent layer of the structure prior to bonding the structure to the substrate.

* * * * *